United States Patent
Variyam

(10) Patent No.: US 6,953,707 B2
(45) Date of Patent: Oct. 11, 2005

(54) METHOD AND SYSTEM FOR CHIP-TO-PACKAGE INTERCONNECTION

(75) Inventor: Manjula N. Variyam, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 129 days.

(21) Appl. No.: 10/447,511

(22) Filed: May 28, 2003

(65) Prior Publication Data

US 2004/0241909 A1 Dec. 2, 2004

(51) Int. Cl.⁷ .............................................. H01L 21/44
(52) U.S. Cl. ...................... 438/106; 438/117; 257/787
(58) Field of Search .................... 257/787; 438/106, 438/112, 117, 124

(56) References Cited

U.S. PATENT DOCUMENTS 6,184,587 B1 * 2/2001 Khandros et al. ........... 257/784
2004/0102064 A1 * 5/2004 Mathieu ...................... 439/66

* cited by examiner

*Primary Examiner*—Caridad Everhart
(74) *Attorney, Agent, or Firm*—Yingsheng Tung; Wade James Brady, III; Frederick J. Telecky, Jr.

(57) ABSTRACT

According to one embodiment of the invention, a method includes providing a semiconductor chip, providing a substrate, forming a plurality of cantilevered springs outwardly from either the semiconductor chip or the substrate, engaging the cantilevered springs with respective contact pads on either the semiconductor chip or the substrate with a fixture, encapsulating the semiconductor chip and cantilevered springs with a molding, and curing the molding.

18 Claims, 4 Drawing Sheets

METHOD AND SYSTEM FOR CHIP-TO-PACKAGE INTERCONNECTION

TECHNICAL FIELD OF THE INVENTION

This invention relates generally to the field of integrated circuits and, more specifically, to a method and system for chip-to-package interconnection.

BACKGROUND OF THE INVENTION

Low-k and ultra low-k dielectric materials used in semiconductor nodes typically have very low tensile strength, which makes them susceptible to cracking due to conventional packaging induced forces. Two such conventional packaging techniques are flip-chipping and wire bonding.

Flip-chipping is a process in which a semiconductor chip has solder bumps attached to one side of the chip and then the chip is "flipped over" and attached to a substrate having solder pads. The chips with the solder bumps are sometimes referred to as "flip chips." This type of packaging technique places the chip layers at the bond pads under high stresses due to thermal stresses encountered during assembly and reliability testing.

Another type of packaging technique is wire-bonding where thin wires are used to connect the bond pads on the chip to the pads on the substrate. These wires have long lead lengths that suffer from poor electrical performance, especially at high speeds. In addition, this technique also puts the chips layers at the bond pads under high stress due to forces encountered during the wire bonding process.

SUMMARY OF THE INVENTION

According to one embodiment of the invention, a method includes providing a semiconductor chip, providing a substrate, forming a plurality of cantilevered springs outwardly from either the semiconductor chip or the substrate, engaging the cantilevered springs with respective contact pads on either the semiconductor chip or the substrate with a fixture, encapsulating the semiconductor chip and cantilevered springs with a molding, and curing the molding.

Some embodiments of the invention provide numerous technical advantages. Other embodiments may realize some, none, or all of these advantages. For example, by using a simple, contact-based approach and "spring" interconnection, the chip layers are under compressive stresses and chance of dielectric cracking during assembly and reliability testing are substantially reduced. The spring may be designed for long fatigue lifetimes, which lengthens the life of the chip. In addition, the lead lengths are shorter than wire bonds, for example, and enhance electrical performance.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 3E of the drawings, in which like numerals refer to like parts.

Figure 1:
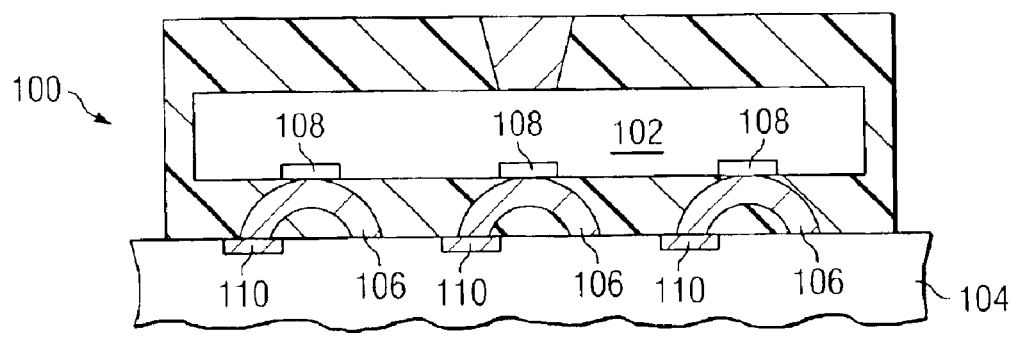
FIG. 1 is a cross-sectional view of a partially completed semiconductor device illustrating the interconnection of a semiconductor chip and a substrate according to an embodiment of the invention.

FIG. 1 is a cross-sectional view of a partially completed semiconductor device 100 illustrating the interconnection of a semiconductor chip 102 and a substrate 104 according to one embodiment of the present invention. Semiconductor chip 102 may be any suitable semiconductor chip having any combination of doped or undoped layers or regions, dielectric layers or regions, and metallization patterns. Substrate 104 may be any suitable substrate formed from any suitable material. In one embodiment, substrate 104 is a glass-fiber-reinforced epoxy resin, such as FR4; however, substrate 104 may be a polyimide, a ceramic film, a laminate substrate, or other suitable substrate.

According to the teachings of one embodiment of the present invention, a plurality of cantilevered springs 106 are utilized to interconnect semiconductor chip 102 and substrate 104 by coupling together a first set of contact pads 108 on semiconductor chip 102 and a second set of contact pads 110 on substrate 104. By using cantilevered springs 106, layers forming semiconductor chip 102 and substrate 104 are generally under compressive stresses, which reduces the chance of dielectric cracking during assembly and reliability testing. Cantilevered springs 106 may also be designed for long lifetimes, as well as enhancing electrical performance due to their shorter lead lengths as opposed to wire bonds. Contact of the cantilevered springs 106 with either first set of contact pads 108 or second set of contact pads 110 is maintained through a molding enveloping semiconductor chip 102, which prevents slipping. This is described in greater detail below in conjunction with FIGS. 3A–3E.

A method of forming cantilevered springs 106 on substrate 104 is described below in conjunction with FIGS. 2A–2H, and thereafter a method of interconnecting semiconductor chip 102 to substrate 104 is described below in conjunction with FIGS. 3A–3E.

FIGS. 2A–2H are a series of cross-sectional views illustrating a method of forming cantilevered springs 106 for use in interconnecting semiconductor chip 102 and substrate 104 in accordance with an embodiment of the present invention. In the illustrated embodiment, cantilevered springs 106 are shown to be formed on substrate 104; however, in other embodiments, cantilevered springs 106 may be formed on semiconductor chip 102.

Figure 2A:
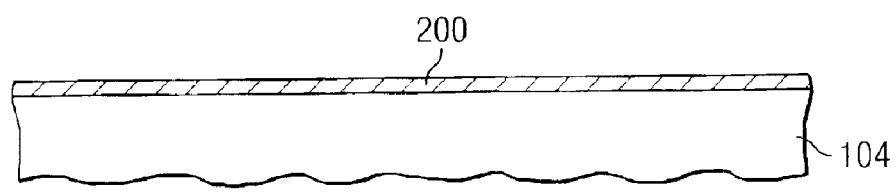
FIGS. 2A through 2H are a series of cross-sectional views illustrating a method of forming a plurality of cantilevered springs for use in interconnecting the semiconductor chip and the substrate of FIG. 1 in accordance with an embodiment of the invention.

FIG. 2A illustrates substrate 104 having a first metal layer 200 formed outwardly therefrom. First metal layer 200 may be formed from any suitable metal, such as copper, and may be formed using any suitable growth and/or deposition techniques used in semiconductor processing. First metal layer 200 may also have any suitable thickness. First metal layer 200 is used to create second set of contact pads 110 on substrate 104. In order to create second set of contact pads 110, first metal layer 200 must be patterned and etched, as described below in conjunction with FIG. 2B.

Figure 2B:
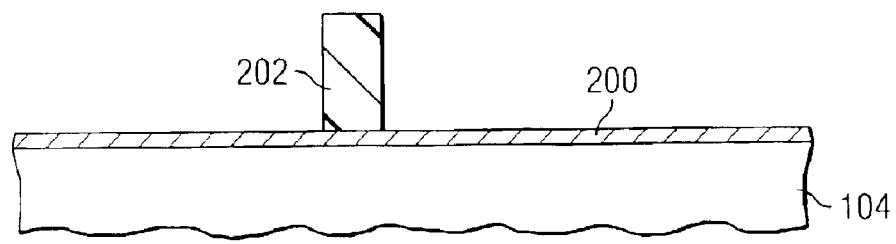
Figure 2C:
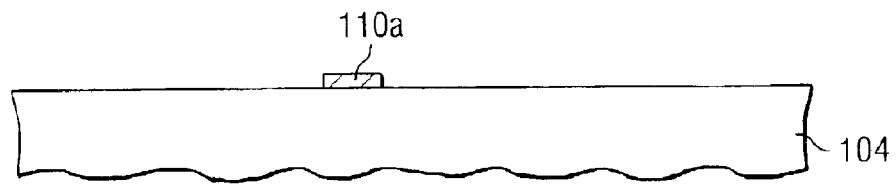

FIG. 2B illustrates a photoresist region 202 masking a portion of first metal layer 200. Photoresist region 202 is formed from any suitable photoresist material by any suitable photolithography technique. The portions of first metal layer 200 that are not covered by photoresist region 202 are then removed using any suitable etching or removal techniques in order to form second set of contact pads 110, as illustrated by a contact pad 110a in FIG. 2C. Contact pad 110a is where a cantilevered spring is formed outwardly therefrom, as described below in conjunction with FIGS. 2D–2H.

Figure 2D:
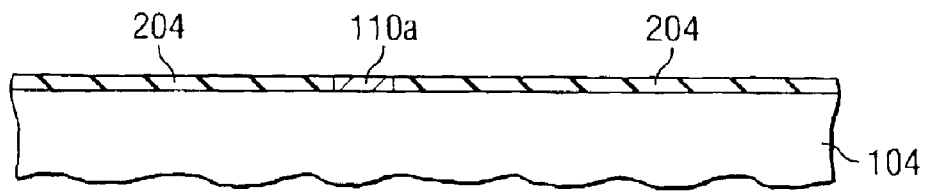

FIG. 2D illustrates a first organic layer 204 formed outwardly from substrate 104 in the same plane as contact pad 10a. First organic layer 204 may be formed from any suitable organic material using any suitable growth and/or deposition techniques used in semiconductor processing. First organic layer 204 may also have any suitable thickness.

Figure 2E:
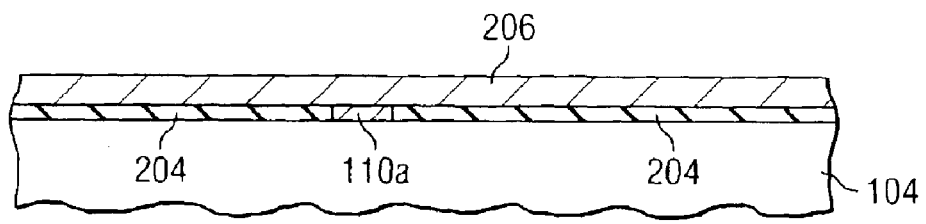

FIG. 2E illustrates a second metal layer 206 formed outwardly from first organic layer 204 and contact pad 110a. Similar to first metal layer 200, second metal layer 206 may be formed from any suitable metal using any suitable growth and/or deposition techniques used in semiconductor processing. Second metal layer 206 may also be formed with any suitable thickness. The metal used to form second metal layer 206 is the metal that is selected for use as cantilever springs 106. In a particular embodiment, the metal used for second metal layer 206 is copper.

Figure 2F:
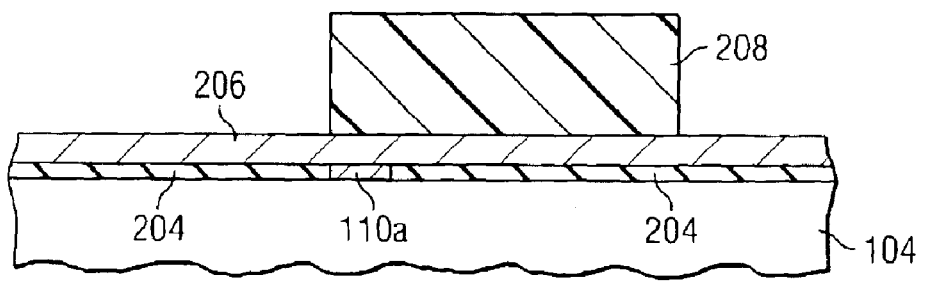

FIG. 2F illustrates a photoresist region 208 formed outwardly from second metal layer 206. Photo resist region 208 is formed from any suitable photoresist material by any suitable photolithography technique. Photoresist region 208 functions to define the general shape and size of cantilevered springs 106. Photoresist region 208 and the portions of second metal layer 206 that are not covered by photoresist region 208 are etched away, as shown below in conjunction with FIG. 2G.

Figure 2G:
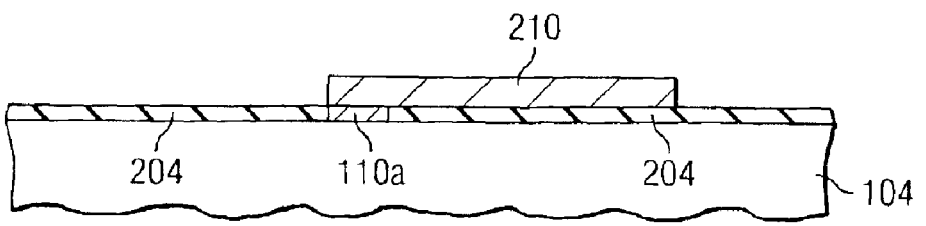

FIG. 2G illustrates substrate 104 having photoresist region 208 and portions of second metal layer 206 removed. This results in a metal region 210 which is used to create cantilevered springs 106 by the removal of first organic layer 204. When first organic layer 204 is etched using any suitable etching techniques, this creates cantilevered springs 106, as illustrated by a cantilevered spring 106a in FIG. 2H.

Figure 2H:
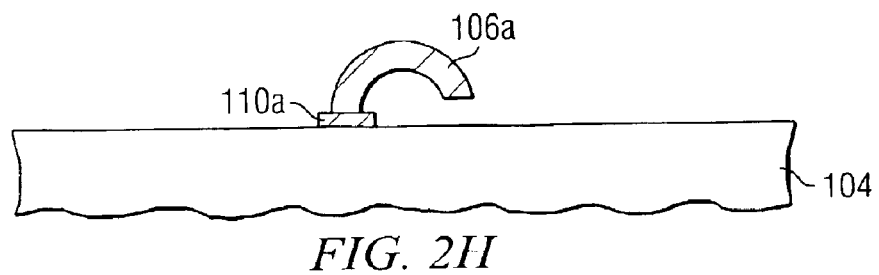

FIG. 2H illustrates the cantilevered spring 106a. As described above, the formation of cantilevered spring 106a is the result of removing first organic layer 204. This causes metal region 210 to "curl-up" and form cantilevered spring 106a. This is due to the residual stresses that are created during the formation of second metal layer 206 (FIG. 2E). The techniques used to create second metal layer 206 may be adjusted and/or otherwise optimized to ensure that the correct residual stresses are introduced so as to create cantilevered springs 106 after first organic layer 204 is removed. This may include adjusting the processing parameters during the formation of second metal layer 206 or, in some embodiments, may involve forming two or more metal layers during the formation of second metal layer 206. In any event, the residual stresses cause the metal region 210 to curl up and create cantilevered springs 106. Substrate 104 is then ready to be coupled semiconductor chip 102, as illustrated below in conjunction with FIGS. 3A–3E.

Figure 3A:
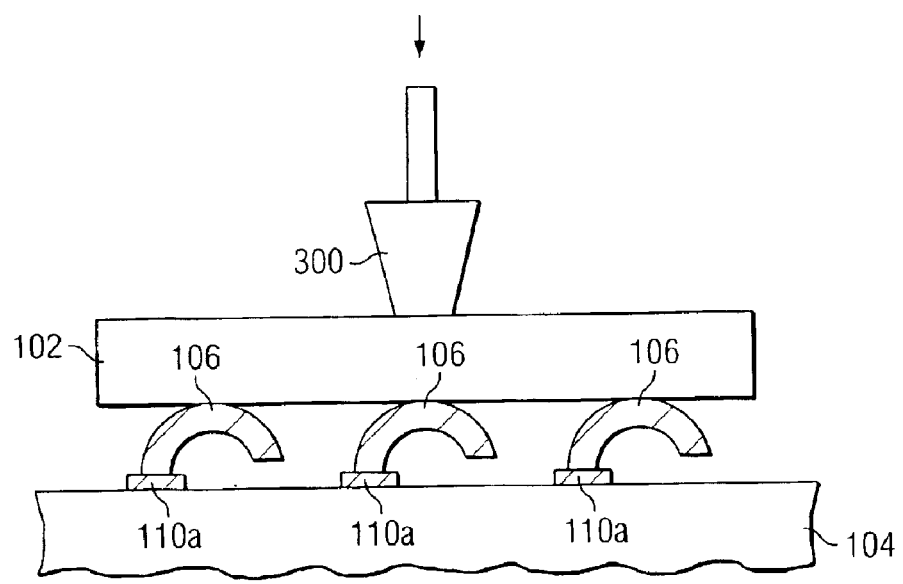
FIGS. 3A through 3E are a series of cross-sectional views illustrating a method of interconnecting the semiconductor chip and the substrate of FIG. 1 in accordance with an embodiment of the invention.
Figure 3B:
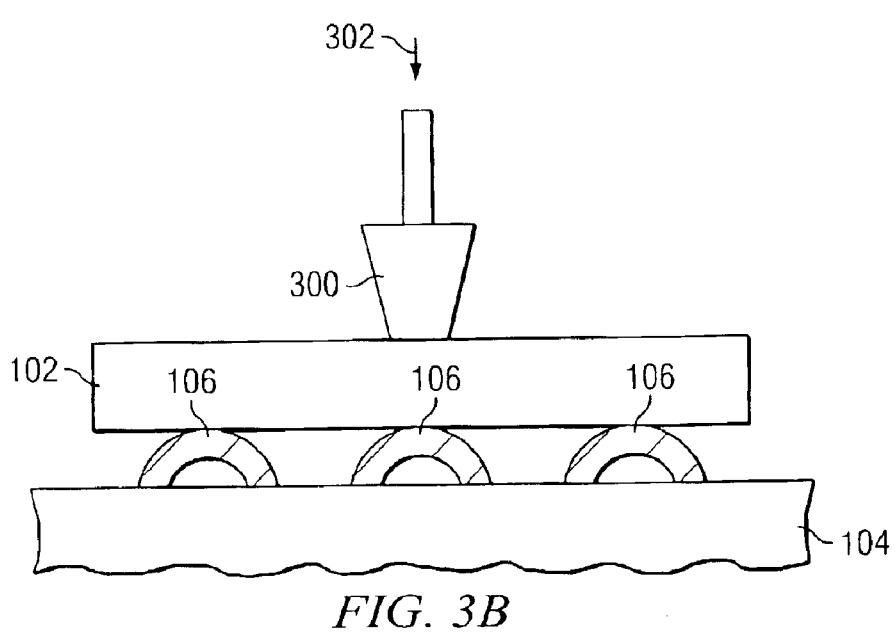

FIGS. 3A–3E are a series of cross-sectional views illustrating a method of interconnecting semiconductor chip 102 and substrate 104 in accordance with an embodiment of the present invention. As illustrated in FIG. 3A, semiconductor chip 102 is engaged with substrate 104 such that cantilevered springs 106 contact first set of contact pads 108 on semiconductor chip 102. This is accomplished by any suitable fixture, as denoted by arrow 300. Semiconductor chip 102 and substrate 104 are compressed together by applying a force (as denoted by arrow 302), which compresses cantilevered springs 106. This introduces compressive forces into cantilevered springs 106. This is illustrated in FIG. 3B.

Figure 3C:
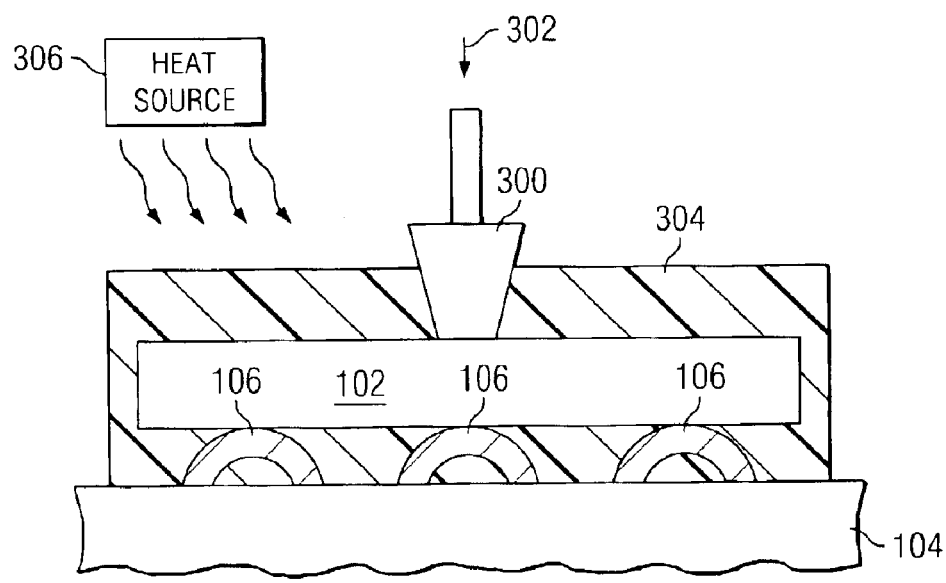

FIG. 3C illustrates a molding 304 that encapsulates semiconductor chip 102 and cantilevered springs 106. Molding 304, in one embodiment, is an epoxy material; however, molding 304 may be other types of thermosetting plastics, thermoplastics, or other types of materials suitable for encapsulating semiconductor chip 102 and cantilevered springs 106 in order to protect semiconductor chip 102 and cantilevered springs 106 from contaminants, harsh environments, or other detrimental effects. Molding 304 may be formed using any suitable techniques used in semiconductor processing and may be formed with any suitable thickness. Molding 304 is then cured using any suitable heat source 306. After molding 304 is cured, fixture 300 is removed.

Figure 3D:
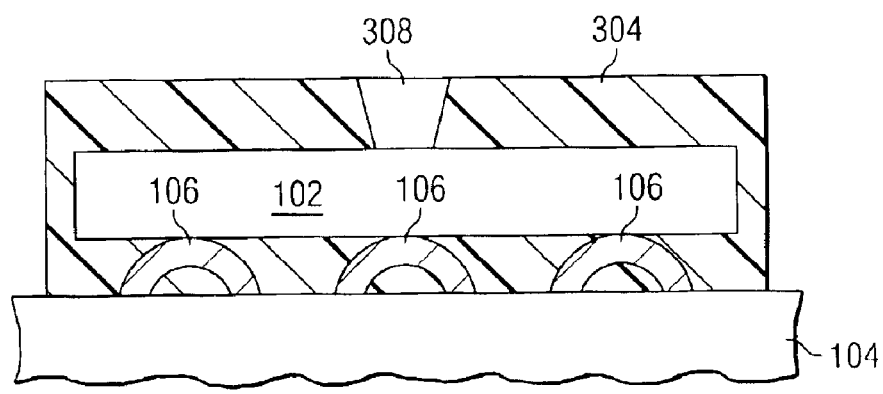
Figure 3E:
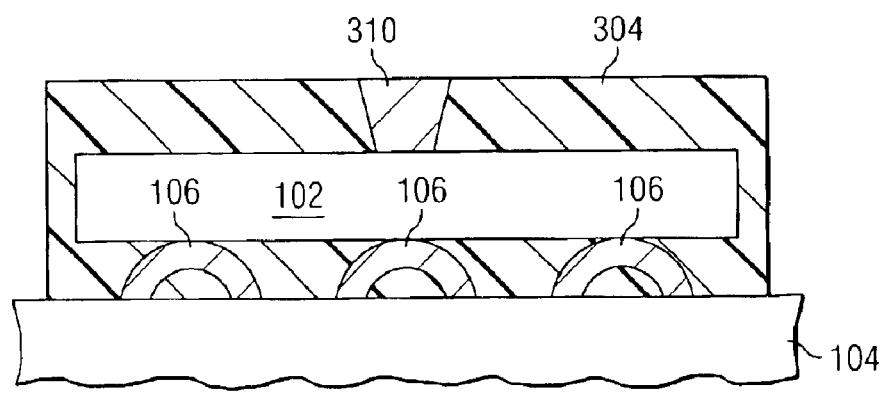

FIG. 3D illustrates a void 308 created as a result of removing fixture 300. Void 308 may be kept as a void, or may be filled with a material 310, as illustrated in FIG. 3E. FIG. 3E illustrates material 310 filling void 308. Material 310 may be any suitable material, such as a metal, an epoxy, or other suitable material. In one embodiment, material 310 is a metal, which may help to dissipate the heat within semiconductor chip 102 during use. In another embodiment, a sacrificial fixture is utilized and is cut-off at the surface of molding 304. Thus, in this embodiment, material 310 is the material of the fixture.

The adhesion between molding 304 and substrate 104 holds semiconductor chip 102 in place such that cantilevered springs 106 electrically couple first set of contact pads 108 and second set of contact pads 110, while ensuring that cantilevered springs 106 are under compressive stresses, instead of primarily tensile stresses. Having cantilevered springs 106 under compressive stresses eliminates problems associated with other packaging techniques, such as flip-chipping or wire bonding. Flip-chipping often places the layers of semiconductor chip 102 or substrate 104 under tensile stresses due to thermal stresses encountered during assembly and reliability testing or due to fatigue. Wire bonding often places the layers of semiconductor chip 102 or substrate 104 under tensile stresses due to forces encountered during the wire bonding process. Having cantilevered springs 106 to interconnect semiconductor chip 102 to substrate 104 eliminates these problems and increases the reliability of semiconductor device 100. One technical advantage of using cantilevered springs 106 that are under compressive stresses rather than tensile stresses is that low-k and ultra low-k dielectric materials may be used for formation of semiconductor device 100, which increases the speed of the device while keeping the noise low.

Although embodiments of the invention and their advantages are described in detail, a person skilled in the art could make various alterations, additions, and omissions without departing from the spirit and scope of the present invention, as defined by the appended claims.

What is claimed is:

1. A method, comprising:
   providing a semiconductor chip and a substrate;

forming a plurality of cantilevered springs outwardly from the semiconductor chip;

engaging the cantilevered springs with respective contact pads on the substrate with a fixture;

encapsulating the semiconductor chip and cantilevered springs with a molding material;

curing the molding material; and removing the fixture and filling a void left by the removal of the fixture with a material.

2. The method of claim 1, further comprising compressing, after engaging the cantilevered springs with respective contact pads, the cantilevered springs between the semiconductor chip and the substrate.

3. The method of claim 1, wherein forming the cantilevered springs outwardly from the chip comprises:

forming a plurality of metal bond pads outwardly from a chip substrate;

forming a first organic layer outwardly from the chip substrate in the same plane as the metal bond pads;

forming a first metal layer outwardly from the metal bond pads and the first organic layer;

removing a portion of the first metal layer; and removing the organic layer.

4. The method of claim 3, further comprising forming a second metal layer outwardly from the first metal layer.

5. The method of claim 1, wherein encapsulating the semiconductor chip and the cantilevered springs with the molding comprises encapsulating the semiconductor chip and cantilevered springs with an epoxy.

6. A method, comprising:

providing a semiconductor chip and a substrate;

forming a plurality of cantilevered springs outwardly from the substrate;

engaging the cantilevered springs with respective bond pads on the semiconductor chip with a fixture;

encapsulating the semiconductor chip and cantilevered springs with a molding material;

curing the molding material; and removing the fixture and filing a void left by the removal of the fixture with a material.

7. The method of claim 6, further comprising compressing, after engaging the cantilevered springs with respective bond pads, the cantilevered springs between the semiconductor chip and the substrate.

8. The method of claim 6, wherein forming the cantilevered springs outwardly from the substrate comprises:

forming a plurality of contact pads outwardly from the substrate;

forming a first organic layer outwardly from the substrate in the same plane as the contact pads;

forming a first metal layer outwardly from the contact pads and the first organic layer;

removing a portion of the first metal layer; and removing the organic layer.

9. The method of claim 8, wherein forming the contact pads comprises forming a contact metal layer outwardly from the substrate and removing a portion of the contact metal layer.

10. The method of claim 8, further comprising forming a second metal layer outwardly from the first metal layer.

11. The method of claim 6, wherein encapsulating the semiconductor chip and the cantilevered springs with the molding comprises encapsulating the semiconductor chip and cantilevered springs with an epoxy.

12. A system, comprising:

a semiconductor chip having a first set of contact pads;

a substrate having a second set of contact pads;

a plurality of cantilevered springs configured to couple the first set of contact pads to the second set of contact pads compressively an encapsulation of a first encapsulant material encapsulating the semiconductor chip and cantilevered springs; and the encapsulation having a top surface with a hole extending from the top surface to one of the chip and the substrate.

13. The system of claim 12, further comprising a second encapsulant material in the hole.

14. The system of claim 12, wherein the cantilevered springs are formed outwardly from the semiconductor chip.

15. The system of claim 12, wherein the cantilevered springs are formed outwardly from the substrate.

16. The system of claim 12, wherein the cantilevered springs are formed from two or more layers of metal.

17. The system of claim 12, wherein the molding comprises an epoxy.

18. The system of claim 12, further comprising a fixture in the hole compressing the chip and the substrate.

* * * * *